US009650815B2

(12) United States Patent
Conner et al.

(10) Patent No.: US 9,650,815 B2
(45) Date of Patent: May 16, 2017

(54) METHOD OF DETECTING MECHANICAL INTERFERENCE OF A POWER CLOSURE MEMBER FOR A VEHICLE

(71) Applicant: FORD GLOBAL TECHNOLOGIES, LLC, Dearborn, MI (US)

(72) Inventors: Gregory Alan Conner, Ann Arbor, MI (US); Markus Link, Koblenz (DE)

(73) Assignee: Ford Global Technologies, LLC, Dearborn, MI (US)

( * ) Notice: Subject to any disclaimer, the term of this patent is extended or adjusted under 35 U.S.C. 154(b) by 348 days.

(21) Appl. No.: 14/277,315

(22) Filed: May 14, 2014

(65) Prior Publication Data

US 2015/0331030 A1    Nov. 19, 2015

(51) Int. Cl.
| | | |
|---|---|---|
| G01R 11/63 | (2006.01) | |
| E05B 79/02 | (2014.01) | |
| G01R 31/00 | (2006.01) | |
| G01R 19/165 | (2006.01) | |
| G08B 21/18 | (2006.01) | |
| E05B 81/64 | (2014.01) | |
| E05B 81/62 | (2014.01) | |

(52) U.S. Cl.
CPC .............. *E05B 79/02* (2013.01); *E05B 81/62* (2013.01); *E05B 81/64* (2013.01); *G01R 19/1659* (2013.01); *G01R 31/006* (2013.01); *G08B 21/182* (2013.01)

(58) Field of Classification Search
CPC ................... E05B 81/62–81/74; G08B 21/182
USPC ...................................................... 324/103 R
See application file for complete search history.

(56) References Cited

U.S. PATENT DOCUMENTS

| | | | |
|---|---|---|---|
| 4,982,984 A | | 1/1991 | Yokota et al. |
| 5,069,000 A | * | 12/1991 | Zuckerman ................ B60J 5/06 49/214 |
| 5,531,498 A | * | 7/1996 | Kowall .................... E05B 81/22 296/146.4 |
| 5,851,050 A | | 12/1998 | Squire et al. |
| RE38,400 E | * | 1/2004 | Kowall ................... E05B 81/14 318/266 |
| 7,070,226 B2 | | 7/2006 | Cleland et al. |
| 7,448,669 B2 | | 11/2008 | Legon et al. |
| 7,538,506 B2 | | 5/2009 | Zinn et al. |
| 7,547,058 B2 | | 6/2009 | King et al. |

(Continued)

FOREIGN PATENT DOCUMENTS

| | | |
|---|---|---|
| DE | 102011082397 A1 | 3/2013 |
| EP | 0968348 B1 | 9/2005 |
| WO | 2013020217 A1 | 2/2013 |

OTHER PUBLICATIONS

Konrad Reif, et al. "HiL Simulation in Convenience Domain"; ATZ worldwide, Jul. 2006, vol. 108, Issue 7-8, p. 22, Abstract.

*Primary Examiner* — Patrick Assouad
*Assistant Examiner* — Demetrius Pretlow
(74) *Attorney, Agent, or Firm* — Jason Rogers; King & Schickli, PLLC

(57) ABSTRACT

A method of fitting a power closure member to a vehicle includes the steps of: (a) detecting, by current sensor, current drawn by a closure member actuator when the closure member is closed and a latch contacts a striker of a lock assembly for the closure member and (b) comparing, by computing device, a detected current to a predetermined current range representative of desired mechanical interference between the latch and the striker.

18 Claims, 4 Drawing Sheets

(56) References Cited

U.S. PATENT DOCUMENTS

| | | | |
|---|---|---|---|
| 7,686,378 B2 | 3/2010 | Gisler et al. | |
| 7,816,878 B2 * | 10/2010 | Heigl | E05F 15/73 318/266 |
| 8,511,738 B2 * | 8/2013 | Brown | B60J 5/0473 296/146.12 |
| 2001/0022049 A1 * | 9/2001 | Clark | B60J 5/06 49/360 |
| 2005/0168010 A1 * | 8/2005 | Cleland | E05F 1/1091 296/146.8 |
| 2006/0181108 A1 * | 8/2006 | Cleland | E05F 15/63 296/146.4 |
| 2008/0184623 A1 * | 8/2008 | Heigl | E05F 15/73 49/31 |
| 2008/0224482 A1 | 9/2008 | Cumbo et al. | |
| 2009/0066488 A1 * | 3/2009 | Qiahe | B60R 25/102 340/426.1 |
| 2010/0250052 A1 * | 9/2010 | Ogino | B60R 1/00 701/31.4 |

* cited by examiner

METHOD OF DETECTING MECHANICAL INTERFERENCE OF A POWER CLOSURE MEMBER FOR A VEHICLE

TECHNICAL FIELD

This document relates generally to power closure members for motor vehicles and, more particularly, to a method of detecting mechanical interference of the power closure member lock assembly to ensure proper fit and adjustment.

BACKGROUND

Power closure members such as, for example, power lift gates and power deck lids are well known in the art. One example of such a device is disclosed in U.S. Pat. No. 7,538,506 to Zinn et al. assigned to Ford Global Technologies, LLC.

Production line fitters currently rely upon margins and flushness of a closure member with other body components in order to fit the closure member to a vehicle. This is largely a process done by "feel" with past experiences playing a key role in the process. In other words the process relies principally upon human judgment and as such is subject to human error.

When the closure member is subjected to a greater mechanical interference between a latch and striker than required for proper operation of the lock assembly, the related mechanical and electrical components of the power closure member are subjected to undo wear over time. Further, in those situations where mechanical interference becomes too great, the power closure member is subjected to an obstacle reversal and will reopen rather than close. Thus, it should be appreciated that proper fitting of a closure member is an important yet difficult task as there is no feedback from the fitting process to properly inform the fitter on how well the closure is being fitted/adjusted.

It has now been determined that mechanical interference is proportional to the current drawn by the closure member actuator when the latch engages the striker of a lock assembly. Thus, it is possible to identify a predetermined current range representative of desired mechanical interference between the latch and striker of a lock assembly. This information can then be used to (a) provide real time data to allow a fitter on the assembly line to properly fit and adjust a closure member to a vehicle and (b) provide a means for monitoring a closure member for proper fit and adjustment during day to day use by the operator and allow preventive maintenance for maintaining proper function of the closure member over time.

SUMMARY

A method of fitting a power closure member to a vehicle may be described as comprising (a) detecting, by current sensor, current drawn by a closure member actuator when the closure is closed and a latch contacts a striker of a lock assembly for the closure member and (b) comparing, by computing device, a detected current to a predetermined current range representative of desired mechanical interference between the latch and the striker. In addition the method may include indicating, by computing device, whether the detected current is inside the predetermined current range. This indicating may include providing, by computing device, a visual indication, an audio indication or both. Further the method may include providing the indication through a communication module of a motor vehicle diagnostic system of the vehicle.

Still further, the method may provide an indication to the individual by a communication module of a motor vehicle diagnostic system such as on a display monitor in the vehicle and/or through the vehicle speaker system. Still further the method may provide the indication to the individual by a communication module of a motor vehicle diagnostic system to a communication device of the individual via a wireless communication network.

In accordance with another aspect, a motor vehicle includes (a) a power closure member, (b) an electrical actuator for opening and closing the closure member, (c) a lock assembly for securing the power closure member, that lock assembly including a latch and a cooperating striker, (d) a current detector and (e) a motor vehicle diagnostic system including a controller and a communication module. Thus a method is provided comprising operating the electrical actuator to close the power closure member, detecting, by the current detector, current drawn by the electrical actuator when the latch contacts the striker of the lock assembly and comparing with the controller the detected current drawn by the electrical actuator to a predetermined range representative of desired mechanical interference between the latch and the striker for optimal operation of the latch assembly.

In addition, other figures of merit related to performance may be provided such as percentage of obstacle detection reserve that remains available in the system, and percentage of target speed, as this data would indicate how close the system is to causing closure reversals. This information can be used beyond the fitting process to enhance the general diagnostic process augmenting preventative maintenance, as these additional metrics can also, provide important information on the impending failure of critical mechanical components (gearbox, etc.).

Further the method includes the step of producing, by the communication module, an indication whether the detected current drawn by the electrical actuator is inside the predetermined range.

The method may further include providing, by the communication module, a visual indication and/or an audio indication. Thus the method may include sending the indication to a personal communication device of an owner of the vehicle via a wireless communication network. That personal communication device may be a cell phone or a computing device. Further the indication may be a voice message or a text message.

In addition the method may include sending the indication in real time to a personal communication device of an individual fitting the power closure member to the vehicle to aid the individual in properly adjusting the closure member.

In the following description there is shown and described in the preferred embodiment of the method. As is it will be realized the method is capable of other different embodiments and its several details are capable of modification in various, obvious aspects all without departing from the method as claimed. Accordingly, the drawings and descriptions will be regarded as illustrative in nature and not as restrictive.

BRIEF DESCRIPTION OF THE DRAWINGS

The accompanying drawings incorporated herein and forming a part of the specification, illustrate several aspects of the present method and together with the description serve to explain certain principles thereof. In the drawings.

Reference will now be made in detail to the present preferred embodiments of the method.

DETAILED DESCRIPTION

Figure 1:
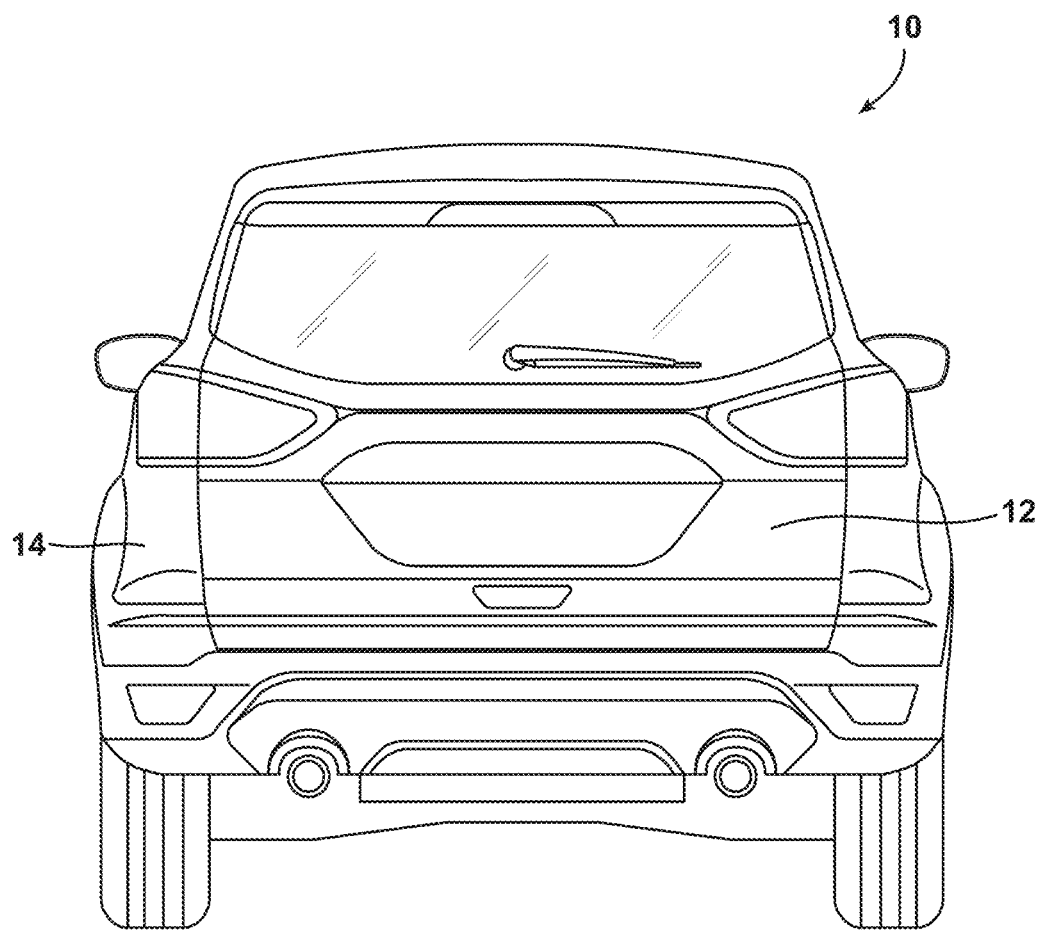
FIG. 1 is a rear elevation view of a lift gate of a motor vehicle in a closed position.
Figure 2:
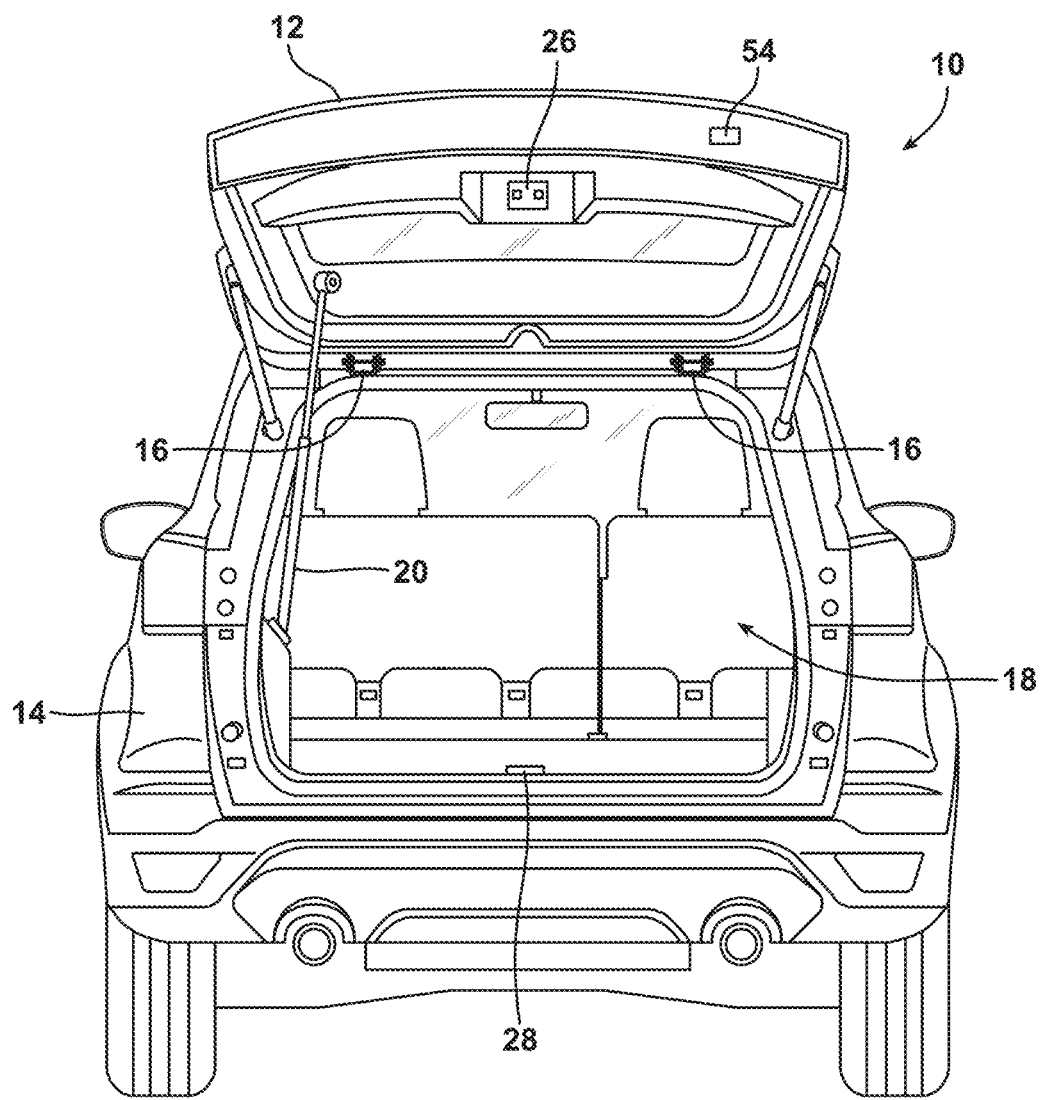
FIG. 2 is a rear elevational view of a lift gate of a motor vehicle in a fully open position.
Figure 3:
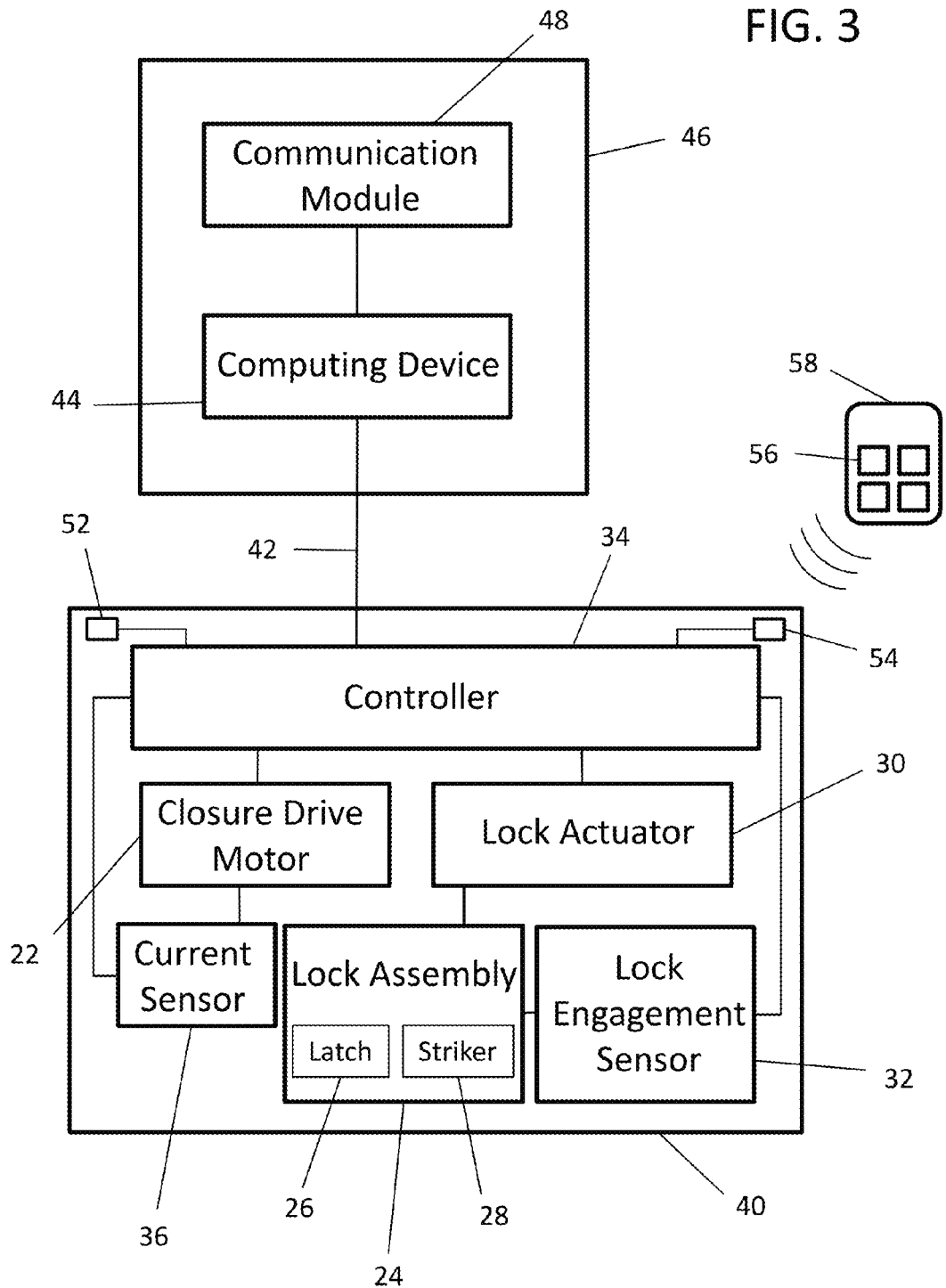
FIG. 3 is a schematical block diagram of the control system for monitoring the mechanical interference of the latch and striker of a lock assembly to ensure proper fit and adjustment of the closure member on the vehicle.

Reference is made to FIGS. 1-3 illustrating a vehicle 10 equipped with a power closure member 12. As illustrated in FIGS. 1 and 2, the power closure member 12 is connected to the body 14 of the vehicle 10 by means of hinges 16. When in the closed position illustrated in FIG. 1, the closure member 12 fully closes the rear of the vehicle. As illustrated in FIG. 2, when open, the closure member 12 provides an expansive opening 18 that allows convenient access to the interior of the vehicle 10.

As illustrated in FIG. 2, the closure member 12 is moved or displaced between the open and closed position by an actuator 20 that may be extended and retracted by an electrical closure drive motor 22 (see also FIG. 3). The actual actuator 20 may take virtually any appropriate form including, but not limited to, (a) a hydraulic actuator wherein the closure drive motor 22 powers a pump for delivering hydraulic fluid to extend or retract the actuator, (b) a lead screw wherein the closure drive motor extends or retracts the lead screw to raise or lower the closure member, or (c) other suitable construction known in the art.

A lock assembly, generally designated by reference numeral 24, secures the closure member 12 when in the closed position illustrated in FIG. 1. As best illustrated in FIG. 3, the lock assembly 24 includes a latch 26 and a cooperating striker 28. In the illustrated embodiment the latch 26 is carried on the closure member 12 while the striker member 28 is carried on the body 14 of the vehicle 10 (see also FIG. 2). It should be appreciated that the relative position of the latch 26 and the striker 28 may be reversed if desired. An electronic lock actuator 30 is provided to release the lock assembly 24 when an individual desires to open the closure member 12. A lock engagement sensor 32 may be provided to detect the locked or unlocked state of the lock assembly 24 at any time.

A controller or ECU 34 controls the operation of the closure drive motor 22 and the lock actuator 30. A current sensor 36, connected to the controller 34 and the closure drive motor 22 allows the controller 34 (or computing device 44 in an alternative embodiment) to monitor the current drawn by the closure drive motor 22 as it is opening and closing the closure member 12. Together, the controller 34, closure drive motor 22, lock actuator 30, lock assembly 24, lock engagement sensor 32 and current sensor 36 form the closure control system module 40.

As further illustrated in FIG. 3 the closure system control module 40 may be connected by bus 42 to a computing device or ECU 44 of an overall motor vehicle diagnostic system 46. Such a motor vehicle diagnostic system 46 may also include a communication module 48 connected to the computing device 44. The motor vehicle diagnostic system 46 may take the form of that disclosed in, for example, U.S. Pat. No. 6,240,347 to Everhart et al., assigned to Ford Global Technologies, Inc. Such a system is also available in the market on Ford Motor vehicles.

Closure member 12 may be opened and closed in a number of different ways. For example, the driver may push a control button 52 on the dashboard or an individual may operate a control handle or push button 54 on the closure member. Alternatively, an operator may push a button 56 on a key fob 58 to initiate a wireless communication signal to the controller 34 (either directly or through computing device 44 and bus 42) which will cause the gate 12 to open or close. In yet another possible embodiment a voice actuation system may be provided wherein an individual with a passive entry passive start key issues the voice command "open liftgate" and a speech processor in the communication module 48 causes the controller 34 to open the liftgate 12 (again through computing device 44 and bus 42).

When the liftgate 12 is closed manually or by any of these other actions, the latch 26 engages the cooperating striker 28 of the lock assembly 24. When the liftgate 12 is properly fitted and adjusted, there is sufficient mechanical interference between the latch 26 and cooperating striker 28 to allow the latch to fully engage the cooperating striker and the lock assembly 24 to thereby secure the closure member 12 in the closed position. However, if the closure member 12 is not properly fitted and adjusted or if it has become out of adjustment due to wear and tear or for other reason, the mechanical interference may be so great as to cause an obstacle reversal: that is, when the latch housing contacts the striker 28, instead of properly engaging the latch assembly, the closure member is reopened.

It has been found that the mechanical interference between the latch 26 and striker 28 is proportional to the current drawn by the closure drive motor 22. Thus, it is possible to identify a predetermined current range (for example between 6 and 9 amperes) representative of the desired mechanical interference between the latch 26 and striker 28 to provide for proper and efficient operation of the closure member 12. In other words, it is possible to identify operational margins for current, current spites, and deviation from target speed, by which a fitter on the assembly line may properly fit and adjust the closure member 12.

With this in mind a method of fitting a power closure member 12 to a vehicle 10 is provided. The method includes detecting by the current sensor 36, the current drawn by the closure member actuator or drive motor 22 when the closure member 12 is closed and the latch 26 contacts the striker 28 of the lock assembly 24. The method further includes comparing, by computing device such as controller 34 or computing device 44, the detected current at the time of contact between the latch 26 and striker 28 to a predetermined current range that is representative of the desired mechanical interference between the latch and striker in order to provide proper operation of the lock assembly 24 and the closure member 12.

The method may further include indicating, by controller 34 or computing device 44, whether the detected current is inside the predetermined current range and thereby within the desired range of mechanical interference for proper operation of the closure member 12. That indication may be provided as a visual indication such as a flashing lamp or a message on a display monitor of a vehicle control system or an audio indication such as a buzzer, a tone or a voice indication through a speech processor connected to the computing device.

In one possible embodiment the indication is provided through the communication module 48 of the motor vehicle diagnostic system 46. Further the indication may be provided to the individual in real time so that the individual working on the assembly line fitting the closure member 12 to the vehicle 10 receives instant feedback to ensure proper fit and adjustment of the closure member. In this way it is possible to ensure the best mechanical interference for efficient operation of a lock assembly 24 while minimizing unnecessary wear and tear and thereby ensuring a long service life. The indication may be provided to the individual or fitter by visual signal and/or via audio signal through a speaker system in the vehicle. Alternatively, or in addition, the indication may be provided on a display monitor on the vehicle and/or via wireless communication such as Blue Tooth or WiFi connection to a receiving communication device worn by the individual or even a public address loud speaker system adjacent the line where the closure member is being fitted.

Stated another way the method may comprise the steps of (a) operating the electrical actuator/closure drive motor 22 to close the power closure member 12, (b) detecting, by the current detector 36, the current actually drawn by the electrical actuator or closure drive motor 22 when the latch 26 contacts the striker 28 and (c) comparing with the controller 34 and/or computing device 44 the detected current drawn by the electrical actuator/closure drive motor 22 to a predetermined range representative of desired mechanical interference between the latch 26 and the striker 28 for optimal operation of the latch assembly 24. Further, the method includes producing, by the communication module 48 of the motor vehicle diagnostic system 46, an indication whether the detected current drawn by the electrical actuator/closure drive motor 22 is inside the predetermined range and thus providing a desired amount of mechanical interference for proper closure member operation.

The method may further include sending the indication to a personal communication device of an owner of the vehicle via a wireless communication network. That personal communication device may, for example, be a cell phone or a computing device. The indication may be a voice message or text message. Thus, should the closure member 12 become out of adjustment for any reason as indicated by the current drawn by the closure drive motor 22 falling outside of or moving toward an end of the predetermined range, the owner of the vehicle is notified to come into a dealer for preventive maintenance and adjustment of the closure member while the closure member is still operating properly.

Figure 4:
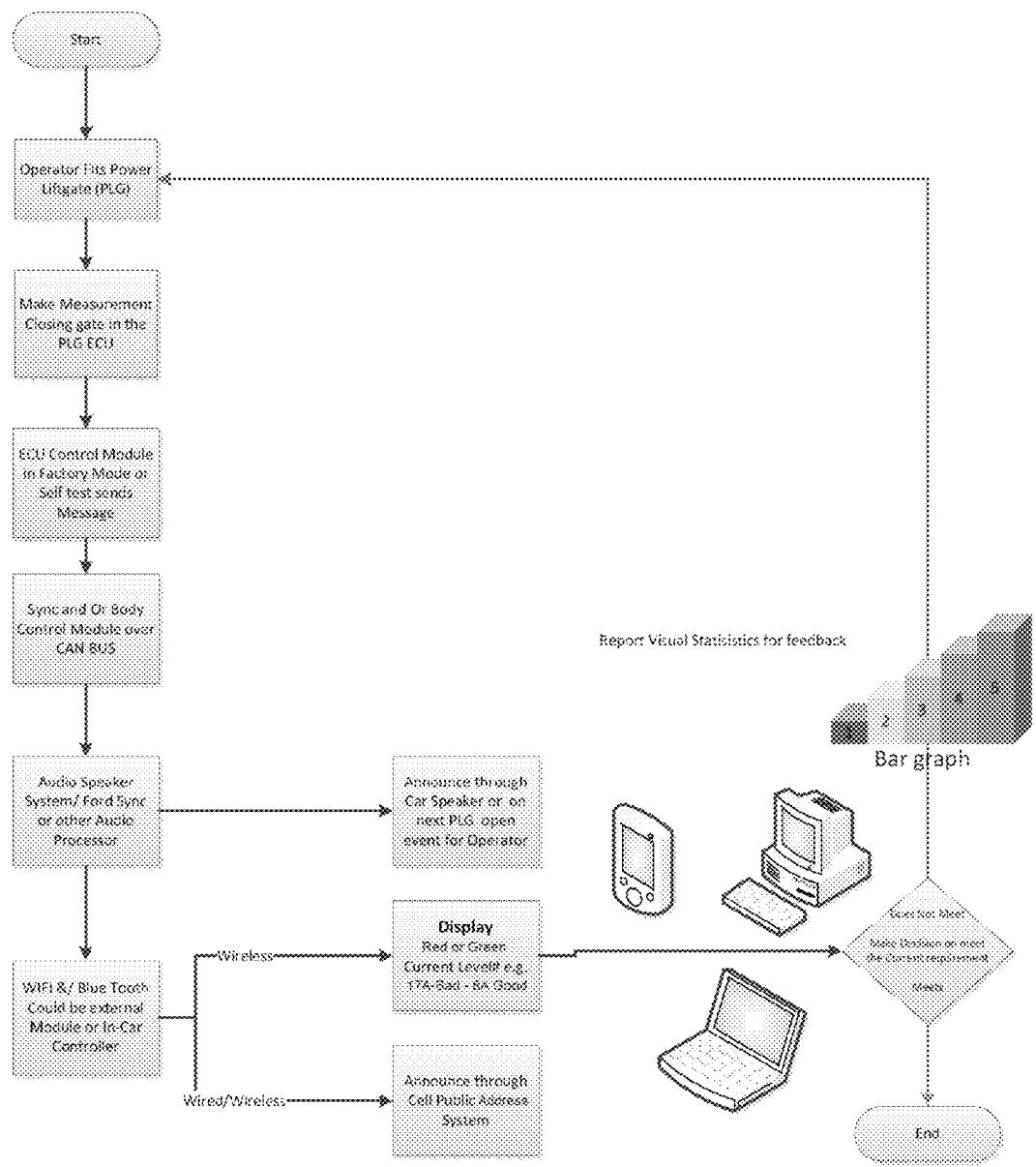
FIG. 4 is a block diagram of the current overall method.

In another embodiment the method includes sending the indication in real time to a personal communication device of an individual fitting the power closure member to the vehicle to aid that individual in properly adjusting the closure member at the time of vehicle assembly. Again, it should be appreciated that the indication may be a voice message or a text message. Further the indication may be sent via the communication module 48 over a wireless communication network (for example WiFi or Blue Tooth networks) to the individual fitting the power closure member 12. Alternatively, the indication may be provided by the communication module 48 through the voice recognition system or console monitor of the vehicle. In one possible embodiment, statistics may be gathered to determine and indicate the effectiveness of each employee fitting a gate on the line as well as the overall effectiveness of all the employees involved in the gate fitting process, and ultimately shift by shift, and overall Production Process Quality Reports. FIG. 4 provides a self-explanatory schematic block diagram of the method.

In summary, numerous benefits are provided by the present method. For the first time those line workers fitting a closure member 12 to a vehicle during vehicle assembly are provided with real time data confirming when the closure member is properly fitted and adjusted for the most efficient and effective operation without undo wear and tear so as to provide a long service life. Further, the vehicle is provided with a method and means for monitoring proper operation of the closure member over time and notifying the owner of any need for preventative maintenance while the closure member is still functioning properly.

The foregoing has been presented for purposes of illustration and description. It is not intended to be exhaustive or to limit the embodiments to the precise form disclosed. Obvious modifications and variations are possible in light of the above teachings. For example, while the closure member illustrated in this document is a lift gate 12, the closure member may also take the form of a tailgate, hood, deck lid, sliding door, pivoting door, trunk lid and the like for a vehicle. All such modifications and variations are within the scope of the appended claims when interpreted in accordance with the breadth to which they are fairly, legally and equitably entitled.

What is claimed:

1. A method of fitting a power closure member to a vehicle, comprising:
   detecting, by current sensor, current drawn by a closure member actuator when said closure is closing and a latch contacts a striker of a lock assembly for said closure member;
   comparing, by computing device, a detected current to a predetermined current range representative of desired mechanical interference between said latch and said striker;
   indicating, by computing device, whether said detected current is inside said predetermined current range; and
   providing said indication to an individual in real time working on an assembly line fitting said closure member to said vehicle.

2. The method of claim 1, wherein said indicating includes providing, by computing device, a visual indication.

3. The method of claim 1, wherein said indicating includes providing, by computing device, an audio indication.

4. The method of claim 1, including providing said indication through a communication module of a motor vehicle diagnostic system of said vehicle.

5. The method of claim 1, including providing said indication to said individual by a communication module of a motor vehicle diagnostic system by (a) visual display on a display monitor in said vehicle, (b) by audio signal through a speaker system of said vehicle or (c) by visual display on said display monitor in said vehicle and by audio signal through said speaker system of said vehicle.

6. The method of claim 1, including comparing by computing device performance as percentage of obstacle detection reserve that remains available in the system, and percentage of target speed, as this data would indicate how close the system is to causing closure reversals.

7. The method of claim 1, including providing said indication to said individual by a communication module of a motor vehicle diagnostic system to a communication device of said individual via a wireless communication network.

8. In a motor vehicle including (a) a power closure member, (b) an electrical actuator for opening and closing said closure, (c) a lock assembly for securing said power closure member, said lock assembly including a latch and a cooperating striker, (d) a current detector and (e) a motor vehicle diagnostic system including a controller and a communication module, a method comprising;

operating said electrical actuator to close said power closure member;

detecting, by said current detector, current drawn by said electrical actuator when said latch contacts said striker;

comparing with said controller the detected current drawn by said electrical actuator to a predetermined range representative of desired mechanical interference between said latch and said striker for optimal operation of said latch assembly and power actuator;

producing, by said communication module, an indication whether the detected current drawn by the electrical actuator is inside said predetermined range; and sending said indication in real time to a personal communication device of an individual fitting said power closure member to said vehicle to aid said individual in properly adjusting said closure member.

9. The method of claim 8, including providing, by said communication module, a visual indication.

10. The method of claim 8, including providing, by said communication module, an audio indication.

11. The method of claim 8, including sending said indication to a personal communication device of an owner of said vehicle via a wireless communication network.

12. The method of claim 11, wherein said personal communication device is a cell phone.

13. The method of claim 11, wherein said personal communication device is a computing device.

14. The method of claim 11, wherein said indication is a voice message.

15. The method of claim 11, wherein said indication is a text message.

16. The method of claim 8, wherein said indication is a voice message, a text message or both.

17. The method of claim 8, wherein said indication is sent over a wireless communication network.

18. A method of fitting a power closure member to a vehicle, comprising:

detecting, by current sensor, current drawn by a closure member actuator when said closure is closing and a latch contacts a striker of a lock assembly for said closure member;

comparing, by computing device, a detected current to a predetermined current range representative of desired mechanical interference between said latch and said striker; and comparing by computing device performance as percentage of obstacle detection reserve that remains available in the system, and percentage of target speed, as this data would indicate how close the system is to causing closure reversals.

* * * * *